(12) United States Patent
Huber

(10) Patent No.: US 12,061,349 B2
(45) Date of Patent: Aug. 13, 2024

(54) ENCAPSULATION OF POLARIZED LIGHT EMITTERS

(71) Applicant: Liminal Space, Inc., Los Angeles, CA (US)

(72) Inventor: Nathaniel Huber, Hollywood, CA (US)

(73) Assignee: Liminal Space, Inc., Los Angeles, CA (US)

( * ) Notice: Subject to any disclaimer, the term of this patent is extended or adjusted under 35 U.S.C. 154(b) by 0 days.

(21) Appl. No.: 18/233,277

(22) Filed: Aug. 11, 2023

(65) Prior Publication Data

US 2023/0384613 A1  Nov. 30, 2023

Related U.S. Application Data

(63) Continuation of application No. 18/079,713, filed on Dec. 12, 2022, now Pat. No. 11,754,852, which is a
(Continued)

(51) Int. Cl.
*H01L 33/56* (2010.01)
*G02B 30/25* (2020.01)
(Continued)

(52) U.S. Cl.
CPC .......... *G02B 30/25* (2020.01); *H01L 25/0753* (2013.01); *H01L 33/56* (2013.01);
(Continued)

(58) Field of Classification Search
CPC ..... G02B 30/25; H01L 25/0753; H01L 33/56; H01L 33/58; H01L 2933/005; H01L 2933/0058; H01L 2933/0091
See application file for complete search history.

(56) References Cited

U.S. PATENT DOCUMENTS 8,399,898 B2   3/2013 Jagt et al.
8,542,270 B2   9/2013 Nelson
(Continued)

FOREIGN PATENT DOCUMENTS

CN   101572286 A   11/2009
CN   102750881 A   10/2012
(Continued)

OTHER PUBLICATIONS

International Preliminary Report on Patentability dated Mar. 5, 2019 for PCT/US2017/048714, 5 pages.
(Continued)

*Primary Examiner* — Anne M Hines
(74) *Attorney, Agent, or Firm* — Fish IP Law, LLP

(57) ABSTRACT

The present invention provides systems, and methods for manufacturing polarized light emitting semiconductor packages, comprising the disposition of a first bonding solution about (a) a first light emitting element and (b) a first polarizing element, wherein the first polarizing element transmits linearly polarized light in a first directionality. A first energy is applied to polymerize the first bonding solution, thereby encapsulating the first polarizing element and a first light emitting element in a first semiconductor package. A second bonding solution is disposed about (a) a second light emitting element and (b) a second polarizing element, wherein the second polarizing element transmits polarized light in a second directionality different from the first directionality, and a second energy is applied to polymerize the second bonding solution, thereby encapsulating the second polarizing element and the second light emitting element in a second semiconductor package.

12 Claims, 2 Drawing Sheets

Related U.S. Application Data continuation of application No. 16/557,900, filed on Aug. 30, 2019, now Pat. No. 11,543,676.

(51) Int. Cl.
*H01L 25/075* (2006.01)
*H01L 33/58* (2010.01)

(52) U.S. Cl.
CPC ........ *H01L 33/58* (2013.01); *H01L 2933/005* (2013.01); *H01L 2933/0058* (2013.01); *H01L 2933/0091* (2013.01)

(56) References Cited

U.S. PATENT DOCUMENTS

| | | |
|---|---|---|
| 2006/0091412 A1 | 5/2006 | Wheatley et al. |
| 2008/0225143 A1 | 9/2008 | Joffer et al. |
| 2010/0006873 A1 | 1/2010 | Raring et al. |
| 2010/0220459 A1 | 9/2010 | Jagt et al. |
| 2010/0231701 A1 | 9/2010 | Nelson |
| 2011/0031513 A1 | 2/2011 | Hsieh et al. |
| 2011/0057557 A1 | 3/2011 | Chi et al. |
| 2012/0057105 A1 | 3/2012 | Jeong |
| 2012/0099193 A1 | 4/2012 | Yang et al. |
| 2012/0205695 A1 | 8/2012 | Lin et al. |
| 2015/0301253 A1 | 10/2015 | Henry |
| 2018/0138246 A1 | 5/2018 | Luo |

FOREIGN PATENT DOCUMENTS

| | | |
|---|---|---|
| CN | 104658439 A | 5/2015 |
| EP | 2819185 B1 | 1/2018 |
| JP | 2014-183192 | 9/2014 |

OTHER PUBLICATIONS

Ong et al., "The activation of directional stem cell motility by green light-emitting diode irradiation", Elsevier Biomaterials 34 (2013) 1911-1920, 10 pages.

International Search Report and Written Opinion dated Dec. 11, 2020 for International Application No. PCT/US2020/048610; 9 pgs.

ENCAPSULATION OF POLARIZED LIGHT EMITTERS

PRIORITY

This application is a continuation application of U.S. Ser. No. 18/079,713, filed Dec. 12, 2022, which is a continuation application of U.S. Ser. No. 16/557,900, filed Aug. 30, 2019. This and all other referenced extrinsic materials are incorporated herein by reference in their entirety.

FIELD OF THE INVENTION

The present invention generally relates to three-dimensional (3D) stereoscopic display systems. More particularly, the invention relates to the application of bonding solutions to light emitting semiconductor packages both in manufacturing and/or final video display assembly.

BACKGROUND

Stereoscopic display systems attempt to recreate a real world visual experience wherein a viewer sees a different view or image in each eye. In a real world viewing experience, a viewer with two eyes sees two slightly different images, as each eye is spaced apart in a slightly different viewing position. A goal of stereoscopic video display systems is to present a separate and different view to each eye of the viewer.

Earlier attempts to recreate a real world visual 3D experience employed an apparatus similar to corrective eyewear comprised of one lens of one color and second lens of a second color. A monitor or projector projected two views on one screen, with each view being color coded so as to be complementary to one eyewear lens or the other. The use of color to segregate viewing channels would often lead to headaches for the viewers.

Recent 3D designs focus on creating a 3D viewing experience within a traditional movie theater environment, using devices centering around a display on a lenticular screen constructed of fabric. However, limited stereoscopic viewing advancements have occurred outside the movie theater environment, including on billboards and other public media/advertising delivery devices. In general, it would be desirable to provide a 3D viewing experience using a wider range of devices, billboards, LED movie theater screens, stadium jumbotrons, and/or other large display devices

SUMMARY OF THE INVENTION

According to one aspect of the present design, there is provided a method for manufacturing polarized light emitting semiconductor packages, comprising the disposition of a first bonding solution about (a) a first light emitting element and (b) a first polarizing element, wherein the first polarizing element transmits linearly polarized light in a first directionality. A first energy is applied to polymerize the first bonding solution, thereby encapsulating the first polarizing element and a first light emitting element in a first semiconductor package. A second bonding solution is disposed about (a) a second light emitting element and (b) a second polarizing element, wherein the second polarizing element transmits polarized light in a second directionality different from the first directionality, and a second energy is applied to polymerize the second bonding solution, thereby encapsulating the second polarizing element and the second light emitting element in a second semiconductor package.

According to another embodiment of the present design, there is provided a stereoscopic display system, having an array of first and second polarized light emitting semiconductor packages, comprising (a) multiple first semiconductor packages and (b) multiple second semiconductor packages, wherein the array comprises rows of polarized light emitting semiconductor packages alternating between members of the multiple first semiconductor packages and members of the multiple second semiconductor packages.

These and other advantages of the present invention will become apparent to those skilled in the art from the following detailed description of the invention and the accompanying drawings.

Various resources, features, aspects and advantages of the inventive subject matter will become more apparent from the following detailed description of preferred embodiments, along with the accompanying drawing figures in which like numerals represent like components.

DETAILED DESCRIPTION

Figure 1A:
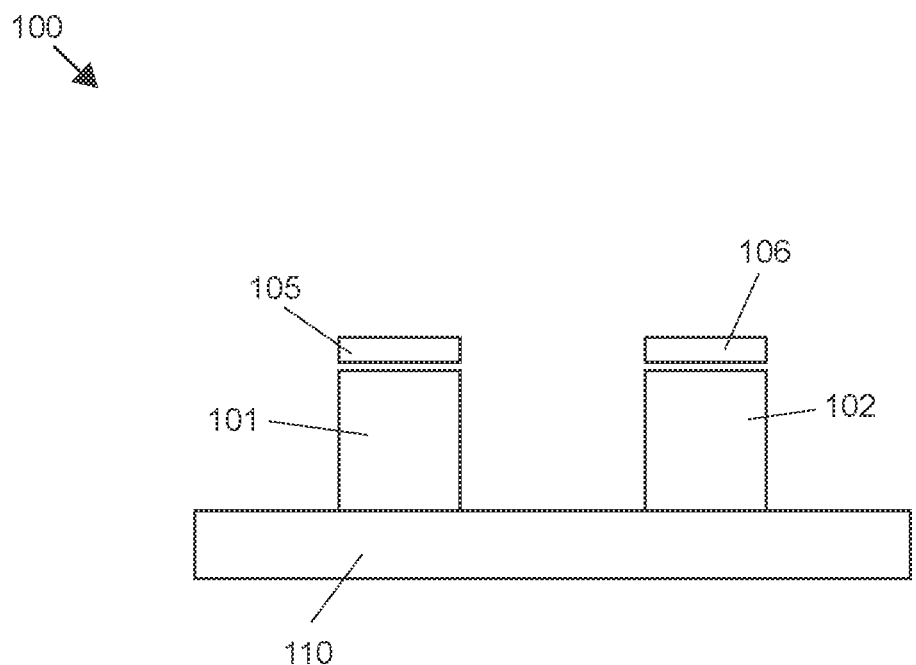
FIG. 1a is a front perspective view of an non-encapsulated semiconductor package pair, each with a polarizer.

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The present design is useful in overcoming issues with previous designs by providing a method of manufacturing encapsulated semiconductor packages with polarizers for use in a stereoscopic display system. The design provides for modular use of polarized material or lenses disposed inside the encapsulated semiconductor packages for displaying 3D image or video content.

It is to be understood that any type of semiconductor package (or "SP") may be employed in the current design. While the present description generally SP's using RGB (red, green, and blue) semiconductors, it is to be understood the invention is not so limited. Any type of semiconductors or similar devices may be employed, including but not limited to RGBY, RGBW (white), RGB plus infrared, OLED, digital RGB, and quantum dot LEDs. In general, the present design relates to the encapsulation of semiconductor packages for stereoscopic viewing.

The design in one particular embodiment includes circular or linear polarized or otherwise polarized or light segregating left and right semiconductor packages arranged in specific patterns and mounted to a circuit board or substrate in alternating rows of right or left polarization configurations.

The use of complimentary linear or circular polarized material assembled as part of each individual right semiconductor package creates a right viewing channel through light exiting through one or more horizontal or diagonal row(s) of right semiconductor packages while a left eye viewing channel is created on another horizontal or diagonal row(s) of left semiconductor packages. The result is a 3D viewing experience on a large device, such as an indoor or outdoor stadium screen or movie exhibiting theater.

The applications for this design are therefore numerous and enable realistic 3D viewing at both outdoor and indoor events such as theaters, movie theaters, concerts, and sporting events or anywhere viewers have appropriate eyewear available for 3D viewing. The embodiments are configured to facilitate permanent 3D encapsulated semiconductor package tile or panel manufacturing. The semiconductor packages when combined into a large display can be used as a standard 2D display by providing 2D video or image content, or the display can show 3D content when playing corresponding stereoscopic 3D video or still images with the appropriate eyewear. Larger display areas (e.g. stadium screens) may beneficially use the teachings herein to provide stereoscopic content.

FIG. 1A is a front perspective view of a semiconductor package pair assembly 100 mounted on a substrate 110. In preferred embodiments, polarizing element 105 is disposed above light emitting element 101, and polarizing element 106 is disposed above light emitting element 102.

A polarizing element can be a flexible or inflexible. In some embodiments, inflexible polarizing element 105 could be made of acrylic or glass. Advantageously, inflexible polarizing element 105 would be more durable, and provide functionality for a longer period of time. For example, inflexible polarizing element 105 could be utilized in the manufacture of a permanent outdoor display where the display would be exposed to a variety of weather conditions.

In other embodiments, flexible polarizing element 106 could be made of film, or other light segregating material. Advantageously, flexible polarizing element 106 could be applied to uneven or irregular surfaces. For example, flexible polarizing element 106 could be installed above an irregularly shaped or otherwise damaged light emitting element. Light emitting elements can be semiconductors. Each semiconductor may be configured to emit a red, green, or blue light.

Figure 1B:
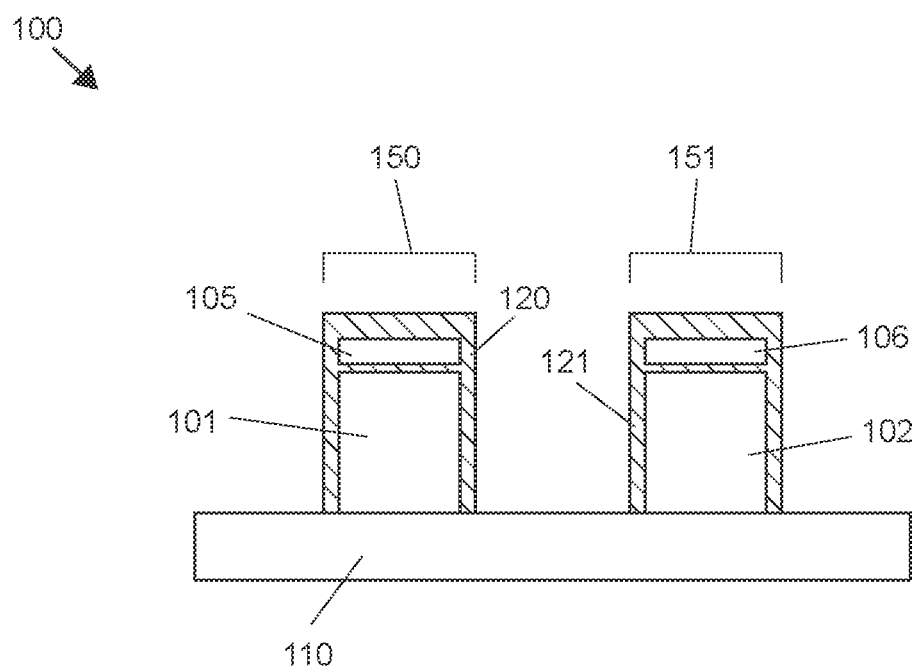
FIG. 1b is a front perspective view of an encapsulated semiconductor package pair, each package having a polarizer.

FIG. 1B is a front perspective view of the semiconductor package pair assembly 100 with a bonding solution. In preferred embodiments, a reactive bonding solution 120 is disposed about light emitting element 101 and polarizing element 105 to form encapsulated semiconductor package 150. In another embodiment, non-reactive bonding solution 121 is disposed about light emitting element 102 and polarizing element 106 to form encapsulated semiconductor package 151.

Polarizing elements can be substantially fixed in place with bonding solutions. Additionally, bonding solutions can be reactive or non-reactive. In some embodiments, reactive bonding solution 120 could be glue, epoxy resin, or silicone. Advantageously, reactive bonding solution 120 can be applied in situations where the bonding solutions need to form an hardened encapsulate at substantially the same time that the bonding solution is applied to light emitting element 101 and polarizing element 105. For example, reactive bonding solution 120 could be utilized in cases where an external energy is not available, such as repairing a damaged encapsulated semiconductor package at the site of display installation.

In other embodiments, non-reactive bonding solution 121 could be an acrylic polymer. Advantageously, non-reactive bonding solution 121 could be used create a strong bond between the adhered components and control the speed at which the bonding process progresses. For example, non-reactive bonding solution 121 could be utilized in cases where the final installation of the display would be in inclement weather conditions, such that the bonding process would need to be stronger to withstand the conditions of installation. In other examples, the non-reactive bonding solution 121 could be utilized in cases where environmental factors are known that could interfere with some curing processes, and where a controlled curing process would be designed to ensure sufficient functionality.

As used herein, bonding solutions, or any derivative thereof, can refer to any one or more of a reactive bonding solution, non-reactive bonding solution, or combination of reactive and non-reactive bonding solutions. Bonding solutions are cured by the application of an energy. Energy can be applied by an internal energy source or an external energy source. An internal energy source can be a chemical reaction within the bonding solution, activated by the mixture of a compound and the bounding solution. In one illustrative example, an external energy source can be focused light emitted by a laser, or heat generated by an oven.

In preferred embodiments, the bonding solution is at least partially transparent to minimize any obscuring of the light emitted by the light emitting elements beneath. Polarizing elements may be lightly sanded on the bottom facing surface (light emitting element facing side) for a better adhesion to the light emitting element.

The bonding solution may be provided between the light emitting element and the polarizing element to ensure that the polarizing element is secured to the light emitting element.

Alternately, an amount of bonding solution may be applied at edges of the components shown, such as edges of the polarizing element to reduce risk of obscuring or impeding transmission from the light emitting elements.

In one embodiment, at least one encapsulated semiconductor package comprises polarizing element for polarizing light in a first polarizing directionality, and another encapsulated semiconductor package comprises polarizing element for polarizing light in a second polarizing directionality.

With respect to use of LEDs generally in stereoscopic image projection, Applicant references the design presented in U.S. Pat. No. 8,542,270 the entirety of which is incorporated herein by reference.

Figure 2:
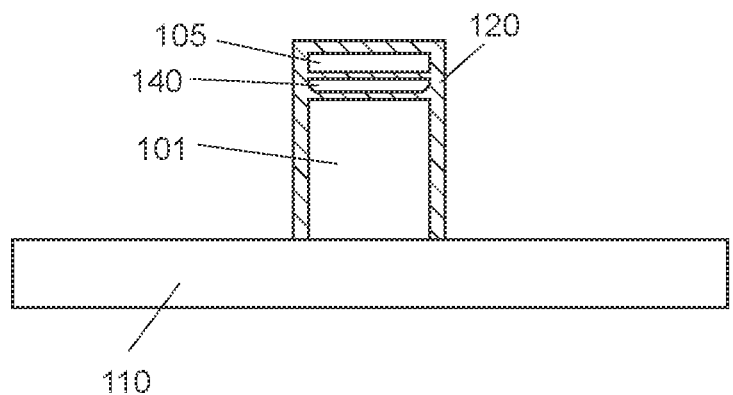
FIG. 2 is a front perspective view of the encapsulated semiconductor package pair, each package having a polarizer and a diffuser.

FIG. 2 is a front perspective view of the semiconductor package pair assembly 100 with a bonding solution and diffusers. In some embodiments, a diffuser 140 is disposed between light emitting element 101 and polarizing element 105.

In a preferred embodiment, the diffuser 140 is cut to substantially similar dimensions as that of the polarizing element 105 in order to diffuse the luminance of light emanated from light emitting element 101 and reduce the concentration of light from a small to a larger area of the polarizing element 105, thus increasing the efficiency of the polarizing element 105 to reduce the ghosting artifacts that interfere with the 3D effect.

Additionally, the use of diffuser 140 for diffusing luminance of light emanated from the light emitting element 101 enhances the three-dimensional effect in at least two ways.

First, the point light source nature of the light emitting element 101 tends to "blow thru" polarizing element 105 causing a ghosting effect that may not be optimal for viewing. The addition of a diffuser 140 spreads out the light, creating a reduced lumens-per-square-millimeter value that enhances the polarization effect.

Second, diffuser 140 also reduces the point of light from the source-effectively smoothing the overall appearance of the display, thus making it possible to view the content on the display at a closer distance without apparent pixilation.

Diffuser 140 is configured to function as an anti-glare surface helping to reject ambient outdoor or room light from the glossy surface of the polarizing element 105. Such a diffusion material serves for reducing glare from light emanated from light sources external to the display assembly, and has the effect to smooth the overall appearance of the display, thus making it possible to view the content on the display at a closer distance without apparent pixilation.

In some embodiments, diffuser 140 may be disposed in front of the custom cut shape of polarizing element 105, to reduce glare from light emanated from light sources outside the light emitting element 101. The diffuser 140 also increases the viewing angle of the display by projecting a polarized image of an illuminated pixel onto the front surface on the diffuser so as to be visible by a viewer at a wide angle.

Figure 3:
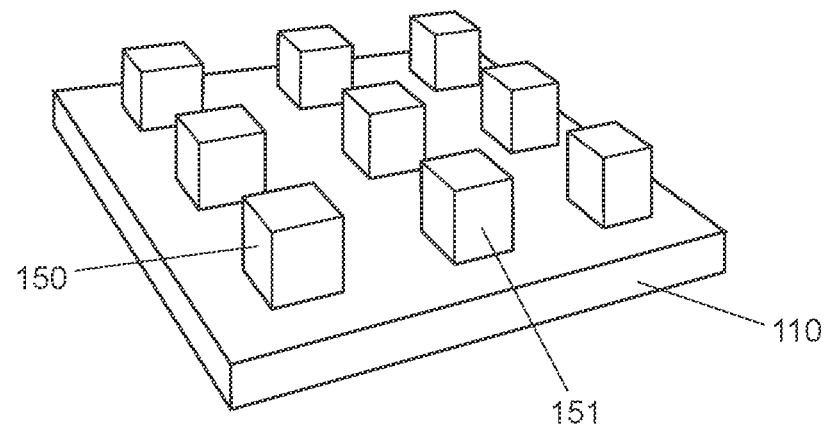
FIG. 3 is a top left perspective view of an array of encapsulated semiconductor packages in a checkerboard configuration.

FIG. 3 is a perspective view of encapsulated semiconductor packages mounted on substrate 110. In preferred embodiments, encapsulated semiconductor packages 150 and 151 are mounted in a row on substrate 110. Substrate 110 comprises multiple rows of multiple encapsulated semiconductor packages to form display assembly 300.

Once the bonding solution is cured, the encapsulated semiconductor packages 150 and 151 are arranged on a substrate. A substrate can be a circuit board. The left LEDs and right LEDs may be arranged in a linear pattern in which the right LEDs are situated in a first set of alternating horizontal rows with the left LEDs in a second set of horizontal rows, the right/left rows alternating.

The encapsulated semiconductor packages 150 and 151 may be arranged in a "checkerboard pattern" in which the rows alternate with right encapsulated semiconductor packages and left encapsulated semiconductor packages The right and left encapsulated polarized semiconductor packages ("SP") can also be referred to as right SP and left SP. When assembling the display with a Pick and Place (PNP) machine, the pattern of the semiconductor packages may be in a checkerboard pattern comprised of alternating diagonal rows of right SP and left SP.

In this arrangement, the SPs begin with (1) a left SP, followed by (2) a right SP, (3) left SP, (4) right SP, (5) left SP, (6) right SP, and so on. The next row of SPs alternates, beginning with (1) a right SP, followed by (2) a left SP, (3) right SP, and so on. The SP display can also have a different pattern of alternating horizontal rows comprised of right SPs and rows of left SPs.

A PNP machine is the most common device used for assembling SPs on an SP display module. The PNP machine receives SPs via carrier tape and reel. The PNP machine receives one or more reels of right SPs and one or more reels of left SPs. The PNP machine alternates sourcing the LEDs from right SPs reel to left SPs reel when placing or assembling the LEDs to achieve the alternating "checkerboard pattern" of right, left, right, left, as discussed above. Alternately, the PNP machine may receive SPs from a single reel or multiple reels holding left SPs and right SPs alternating in sequence-right, left, right, etc. In this case the PNP machine is programmed to place the alternating SPs from a single tape and reel to the specified alternating polarized SPs pattern location to match the alternating diagonal row pattern (checkerboard pattern) or desired horizontal row pattern.

The design may include more than one SP situated in a consistent rotational orientation in a carrier tape spooled on a single or multiple reels for use in a PNP machine. The specific rotation of the SPs is employed in placing of the SPs on the substrate in an alternating horizontal pattern or diagonal pattern.

Each carrier tape holds alternating left and right LEDs for use in a PNP machine that employs one or more reels to assemble LED tiles or modules. The orientation of the LEDs is correct within the carrier tapes shown and as a result a PNP machine does not need to evaluate orientation. If any carrier tape can be used, such a machine would need to be furnished with orientation evaluation functionality. In other words, the orientation for the LED is either known to the machine or, if not known, can be determined using orientation functionality (e.g., machine viewing and determination, human viewing, etc.)

Some carrier tapes hold alternating left and right encapsulated polarized semiconductor packages. Using this arrangement, two separate reels are not necessary to feed a PNP machine. A single reel can be used to feed the PNP machine, with the carrier tape arrangement or PNP machine including functionality to determine the orientation of the encapsulated polarized semiconductor package, i.e. left or right.

To maintain consistent rotational orientation of the encapsulated polarized semiconductor packages, the SPs are typically supplied to a PNP machine via carrier tape and reel. The carrier tape holds the SPs proper rotation based on the SPs rotation relative to guide holes of the carrier tape. A left SP is placed where a left SP is to be placed, and the same is true for a right SP.

Alternately, an alternating pattern of more than one right SP and left SP are provided in a carrier tape (right/left/right/left etc.) spooled on a single reel or multiple reels for PNP machine use. In either implementation, the carrier tape may have a unique guide or registration hole next to the carrier that corresponds with orientation of the SP, i.e. either a left SP or right SP. This registration hole or guide is recognizable to the PNP machine for proper programming and placement. The registration hole or guide will also define the rotational orientation of the SP in the carrier, recognizable to the PNP machine for programming and placement.

The plurality of left and right polarizers are maintained in place on top of the assembled LEDs to form the fully assembled 3D LED video tile or module. Integration of polarizer lenses into the LED video tile's front facing plastic (or alloy) grid results in a 2D and 3D LED video display tile dictated by the video or image content displayed using the device The combination of the precise orientation of the right polarizer(s) and left polarizer(s) assembled in an alternating pattern in a series of one LED module or multiple LED modules results in a 3D stereoscopic viewing experience when used with matched 3D glasses when images in a corresponding stereoscopic video format are transmitted. The corresponding 3D video format matches one or more left eye video pixel(s) with left polarized LEDs and one or more right eye video pixel(s) with right polarized LEDs, with all LEDs mounted on the circuit board/substrate.

A "checkerboard" pattern of the left and right polarizers and filters is provided in this particular arrangement inside the protective cover.

Additionally, the present design may include the foregoing wherein at least one left LED comprises a left diffuser material positioned between the left polarizing element and the left light transmitter arrangement, and at least one right LED comprises a right diffuser material positioned between the right polarizing element and the right light transmitter arrangement. The plurality of left LEDs may be linearly arranged in a plurality of rows of left LEDs with a plurality of rows of right LEDs interspersed between the rows of left LEDs or the plurality of left LEDs and the plurality of right LEDs may be arranged in a checkerboard pattern. Further, at least one left polarizing element may be joined to at least one left housing using a bonding material.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something designated from the group consisting of A, B, C . . . and N, the text should be interpreted as requiring only one element from the group, not A plus N, or B plus N, etc.

The invention claimed is:

1. A method of manufacturing a stereoscopic display system having left and right polarized light emitting semiconductor packages, comprising: placing left and right polarized light emitting semiconductor packages on a substrate; applying a bonding solution above and to multiple sides of the packages; and applying first energy to polymerize the bonding solution, thereby encapsulating the packages.

2. The method of claim 1, wherein the step of placing comprises positioning the left and right polarized light emitting semiconductor packages on the substrate in a checkerboard pattern.

3. The method of claim 1, wherein the left and right polarized light emitting semiconductor packages are on the substrate in alternating rows, respectively.

4. The method of claim 1, wherein the left and right polarized light emitting semiconductor packages include a glare-reducing composition.

5. The method of claim 1, wherein polymerizing the bonding solution provides a hardened protective cover for the left and right polarized light emitting semiconductor packages.

6. The method of claim 1, wherein the bonding solution is at least partially transparent.

7. A stereoscopic display system having left and right polarized light emitting semiconductor packages disposed on a substrate, comprising a polymerized bonding solution disposed above and to the sides of the light emitting semiconductor packages.

8. The system of claim 7 wherein the left and right polarized light emitting semiconductor packages are disposed on the substrate in a checkerboard pattern.

9. The system of claim 7 wherein the left and right polarized light emitting semiconductor packages are disposed on the substrate in alternating rows, respectively.

10. The system of claim 7 wherein the left and right polarized light emitting semiconductor packages include a glare-reducing composition.

11. The system of claim 7 wherein the bonding solution is hardened, thereby providing a protective cover.

12. The system of claim 7 wherein the bonding solution is at least partially transparent to minimize any obscuring of the light.

* * * * *